United States Patent [19]
Min

[11] Patent Number: 6,097,045
[45] Date of Patent: Aug. 1, 2000

[54] SEMICONDUCTOR DEVICE HAVING DISCHARGING PORTION

[75] Inventor: Dae Sung Min, Cheongju, Rep. of Korea

[73] Assignee: LG Semicon Co., Ltd., Chungcheongbuk-Do, Rep. of Korea

[21] Appl. No.: 09/223,819

[22] Filed: Dec. 31, 1998

[30] Foreign Application Priority Data

Jan. 9, 1998 [KR] Rep. of Korea .......................... 98/365

[51] Int. Cl.[7] ...................... H01L 27/168; H01L 29/768
[52] U.S. Cl. ........................................ 257/233; 257/435
[58] Field of Search ................................. 257/232, 233, 257/234, 435

[56] References Cited

U.S. PATENT DOCUMENTS

| | | | |
|---|---|---|---|
| 5,028,970 | 7/1991 | Masahoshi . | |
| 5,210,433 | 5/1993 | Ohsawa et al. ........................ | 257/250 |
| 5,576,538 | 11/1996 | Sakai et al. ............................. | 250/251 |
| 5,744,831 | 4/1998 | Tanaka .................................... | 257/225 |
| 5,773,859 | 6/1998 | Uens ....................................... | 257/294 |
| 5,825,840 | 10/1998 | Anagnostopoulos ................... | 377/60 |

OTHER PUBLICATIONS

You, K. et al., "A Novel Two–Step Etching Process for Reducing Plasma–Induced Oxide Damage", *Solid State Electronics*, vol. 39, No. 5, 1996, pp. 689–693.

*Primary Examiner*—Ngân V. Ngô
*Attorney, Agent, or Firm*—Morgan, Lewis & Bockius LLP

[57] ABSTRACT

A semiconductor device and a fabrication method are disclosed which are capable of preventing a charge-up phenomenon which occurs during a plasma process, and the semiconductor device includes a center portion of a semiconductor device having a passing through portion and a blocking portion and formed on the center portion of the semiconductor substrate, and a peripheral portion having a pad and a discharging portion formed near the pad and connected with the ground.

12 Claims, 4 Drawing Sheets

SEMICONDUCTOR DEVICE HAVING DISCHARGING PORTION

BACKGROUND OF THE INVENTION

1. Field of the Invention

The present invention relates to a semiconductor device and a fabrication method thereof, and in particular to a charge coupled device (CCD) and a fabrication method thereof which are capable of preventing a charge-up phenomenon which occurs during a plasma process.

2. Description of the Background Art

In order to increase the intensity of a semiconductor device, it is necessary to reduce a design rule. Namely, a fabrication process margin should be reduced. In order to satisfy a reduced design rule, a pattern should be accurately formed when fabricating a semiconductor device. The etching process which uses a plasma such as a reactive ion etching (RIE), etc. has been widely used for implementing the above-described accurate pattern formation. However, the etching process which uses a plasma is capable of accurately forming a pattern. However, this process has a disadvantage in that it affects a semiconductor device. Namely, since a wafer is exposed to a non-uniform plasma environment, it is impossible to obtain a uniform characteristic of a semiconductor device. In addition, the devices are applied with an electrical stress due to a charge-up which occurs on the upper surface of the wafer for thereby decreasing the operational performance of the semiconductor device.

The structure of a known semiconductor device and a fabrication method thereof will now be explained with reference to the accompanying drawings and the problems that an electric charge which is induced by an etching affects the semiconductor device will be explained.

FIG. 1 is a plan view illustrating the known semiconductor device.

A center portion 2 and a peripheral portion 3 of a semiconductor device are formed on a semiconductor substrate 1. The center portion 2 of the semiconductor device is formed of a photo metallic layer formed of a photo diode 21 which is a passing-through portion which passes through light and a blocking portion 22 which does not pass through light. In addition, a pad 31 is formed on the peripheral portion 3 of the semiconductor device for electrically connecting an external circuit and the semiconductor device.

FIG. 2 is a cross-sectional view taken along the line II—II' of FIG. 1 and illustrating a peripheral portion of a known semiconductor device.

A p-well 11 (hereinafter called Electrostatic Discharge (ESD) p-well 11) is formed in the semiconductor substrate 1 for implementing an electrostatic discharge, and a device isolation region "a" is formed on both marginal portions of the ESD-well 11. N-type diffusion layers 12 and 13 and a p-type diffusion layer 14 are formed in the ESD p-well 11. A first insulation layer 15 is formed on the upper surface of the semiconductor substrate 1. The first insulation layer 15 is formed in a double layer structure of an HLD layer 15a and a BPSG layer 15b. Contact holes 12a and 13a are formed on the n-type diffusion layers 12 and 13, and a contact hole 14a is formed on the p-type diffusion layer 14. Metallic wiring portions 12b, 13b and 14b are formed in the contact holes 12a, 13a and 14a and on the upper surface of the insulation layer, respectively. A second insulation layer 16 is formed on the upper surfaces of the metallic wiring portions 12b, 13b and 14b and the upper surface of the first insulation layer 15. The second insulation layer 16 is formed of a P—SiO film.

A P—SiN film is formed on the upper surface of the second insulation layer 16 as a protection layer 17 for protecting the semiconductor device. A planarizing layer 18 is formed on the upper surface of the protection layer 17 for planarizing the semiconductor device. A pad hole 19 is formed on the metallic wiring portion 12b for forming the pad 31, and a metallic layer is deposited in the pad hole 19 for thereby forming a pad 31.

The fabrication method of a semiconductor device will now be explained.

First, a p-type dopant ion is implanted into the n-type semiconductor substrate 1 for forming an ESD p-well 11. A device isolation region "a" is formed on the upper surface of the semiconductor substrate 1 and at both sides of the p-well 2 using a LOCOS process. Next, n-type diffusion layers 12 and 13 are formed in the p-well 2 and then a p-type diffusion layer 14 is formed. Thereafter, a HLD 15a and BPSG 15b are sequentially formed for forming the first insulation film 15. Contact holes 12a, 13a and 14a are formed to expose the upper surfaces of the n-type diffusion layers 12 and 13 and the p-type diffusion layer 14 by etching the first insulation film 15.

When forming the contact holes 12a, 13a and 14a, the etching operation is performed using a plasma. A metallic layer is coated in the interior of the contact holes 12a, 13a and 14a and on the upper surface of the second insulation film 15b for forming a connection wiring portion between the devices and then are patterned for thereby forming metallic wiring portions 12b, 13b and 14b. When patterning the metallic layer for forming the metallic wiring portions 12b, 13b and 14b, the etching operation is performed using a plasma. Thereafter, the second insulation film 16 is formed on the upper surfaces of the first insulation film 15 and the metallic wiring portions 12b, 13b and 14b. A blocking layer, namely, a photo metallic layer (not shown) is formed on the upper surface of the second insulation film 16 for blocking light. At this time, the second insulation film 16 is a P—SiO film, and the photo metallic layer (not shown) is a metallic film such as a tungsten (W), TiW, TiN, Al, MoSix, etc. The photo metallic layer (not shown) formed on the passing through portion 21 and the peripheral portion 3 of the semiconductor substrate are etched and removed using a plasma. Namely, the photo metallic layer is formed only on the upper surface of the center portion 2 of the semiconductor device except the photo diode 21. The CCD is a device for converting light into an electrical signal. Since the CCD receives light through the photo diode, the region except the region of the photo diode should be blocked from light. However, since the peripheral portion 3 of the semiconductor device does not need to block light, the photo metallic layer formed on the upper surface of the peripheral portion 3 is generally etched and removed. The P-SiN layer is formed as the protection film 17 for protecting the semiconductor device, and the pad hole 19 is formed on the upper surface of the metallic wiring portion 12b connected with the n-type diffusion layer 12 for forming the pad connecting the device formed on the semiconductor substrate 1, namely, the n-type diffusion layer 12 and the external circuit. Thereafter, the planarizing layer 18 is formed in the pad hole 19 and on the upper surface of the protection layer 17 for forming a u-lens (not shown) of the photo diode 21. Thereafter, the planarizing layer 18 is etched so that the upper surface of the metallic wiring portion 12b is exposed, and then the pad hole 19 is formed, and the metallic layer is deposited in the pad hole 19 for thereby forming a pad 31.

The etching process is repeatedly performed using a plasma, and negative electric charges are charged up on the upper surface of the semiconductor device during the above processes. FIG. 3 is a schematic view illustrating a semiconductor device which illustrates a current leakage phenomenon between the ESD p-well 11 formed near the pad of the semiconductor substrate 1 and the main p-well 91 formed on the center portion of the semiconductor substrate 1 by the charging-up operation.

Namely, FIG. 3 illustrates the ESD p-well 11 connected with the pad 31 in the semiconductor substrate 1 and the main p-well 91 for forming a semiconductor device. The first insulation layer 15, the second insulation layer 16, the protection layer 17, and the planarizing layer 18 are sequentially deposited on the upper surface of the semiconductor substrate 1. A high voltage of about 9V is applied to the ESD p-well 11 through the pad 31 and the main p-well 91 is connected with the ground. Th negative electric charges are accumulated on the upper surface of the planarizing layer 18, and the electric charges are trapped in the interfaces between the first and second insulation layers 15 and 16, the protection layer 17, and the planarizing layer 18, so that positive electric charges are induced on the surface of the semiconductor substrate, and the depletion layer is formed on the surface of the n-type semiconductor substrate. As the positive electric charges are induced on the surface of the semiconductor substrate 1, a p-channel effect is formed between the ESD p-well 11 and the main p-well 91. Therefore, when a high voltage is applied to the ESD p-well 11, a current is leaked between the ESD p-well 11 and the main p-well 91, so that a direct current (DC) error occurs in the semiconductor device.

In addition, since the positive electric charges are induced on the surface of the semiconductor, the threshold voltage is varied, and the malfunction may occur in the semiconductor device.

Furthermore, while the electric charges are moving along the polysilicon or metallic wiring portion, the electric charges may damage a weak portion of the semiconductor device such as a gate oxide film, etc.

In addition, the charge-up may be concentrated on the center portion of the wafer rather than on the margin portions, so that the characteristic of the semiconductor device may be changed in accordance with the position of the semiconductor device.

SUMMARY OF THE INVENTION

Accordingly, it is an object of the present invention to provide a semiconductor device and a fabrication method thereof which overcome the aforementioned problems encountered in the background art.

It is another object of the present invention to provide a semiconductor device and a fabrication method thereof which are capable of preventing a malfunction due to the charge-up by effectively discharging the electric charges generated during a plasma process.

It is another object of the present invention to provide a semiconductor device and a fabrication method thereof which are capable of preventing a direct current (DC) error due to a current leakage between an ESD p-well and a main p-well.

To achieve the above objects, there is provided a semiconductor device which includes a center portion having a passing through portion in which light is passed therethrough and a blocking portion in which light is blocked thereby, and a peripheral portion having a pad and a discharging portion.

To achieve the above objects, there is provided a semiconductor device fabrication method which includes the steps of preparing a semiconductor substrate, forming a diffusion layer on the semiconductor substrate, forming a first insulation layer on an upper surface of the semiconductor substrate, forming a contact hole by exposing a predetermined region of the diffusion layer, forming and patterning a metallic layer on an upper surface of the first insulation layer and in the contact hole for thereby forming a metallic wiring portion, forming a second insulation layer on upper surfaces of the metallic wiring portion and the first insulation layer, forming a photo metallic layer on an upper surface of the second insulation layer for blocking light, and forming a passing through portion and a pad hole by etching the photo metallic layer.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The semiconductor device and a fabrication method thereof according to the present invention will now be explained with reference to the accompanying drawings.

Figure 1:
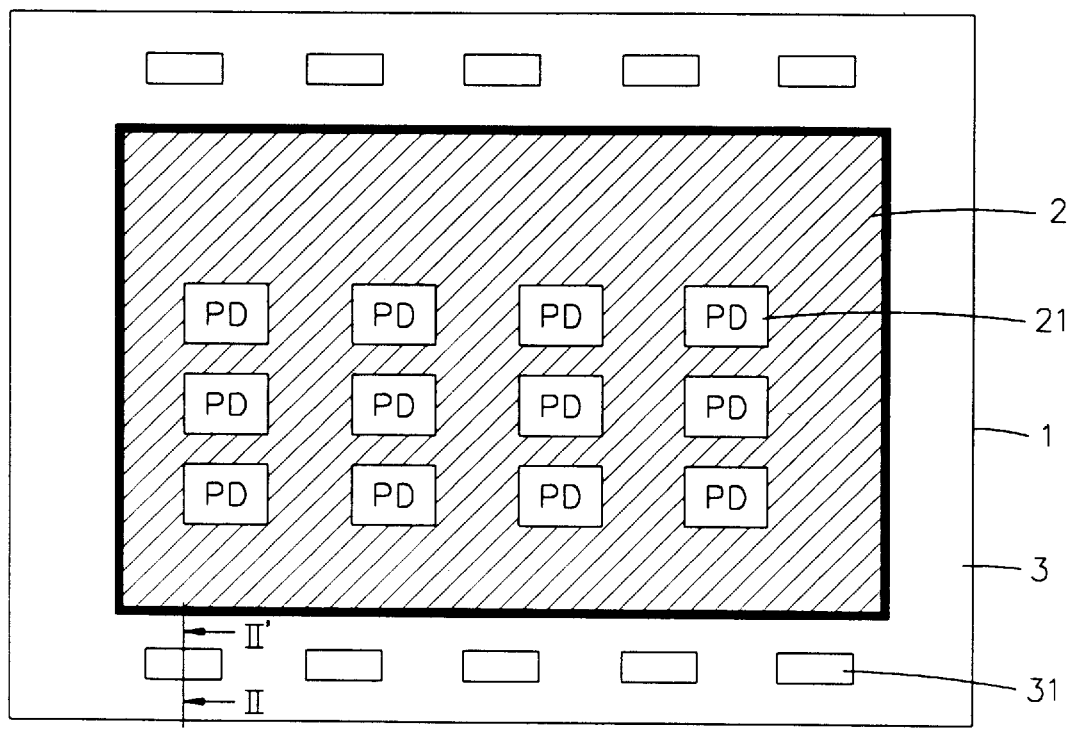
FIG. 1 is a plan view illustrating a known semiconductor device.
Figure 2:
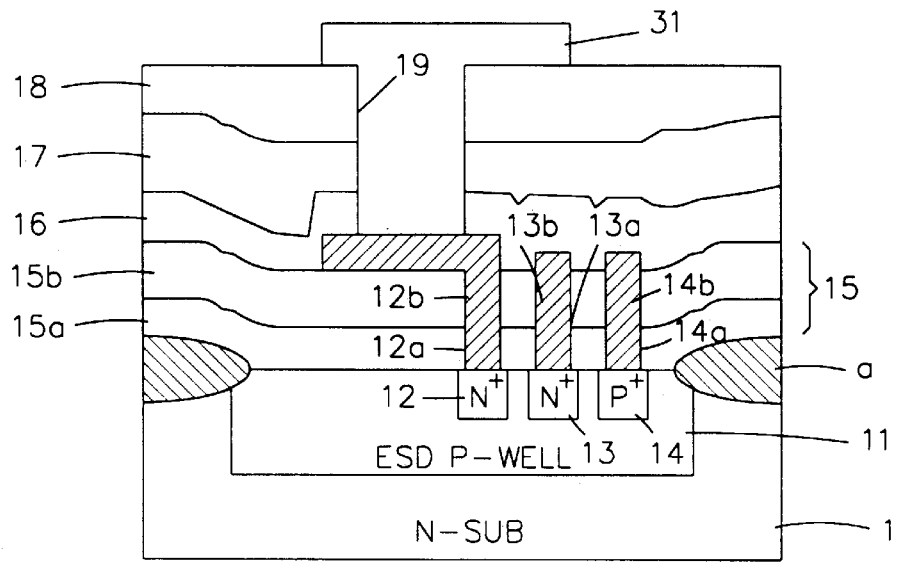
FIG. 2 is a cross-sectional view taken along the line II—II' of FIG. 1.
Figure 3:
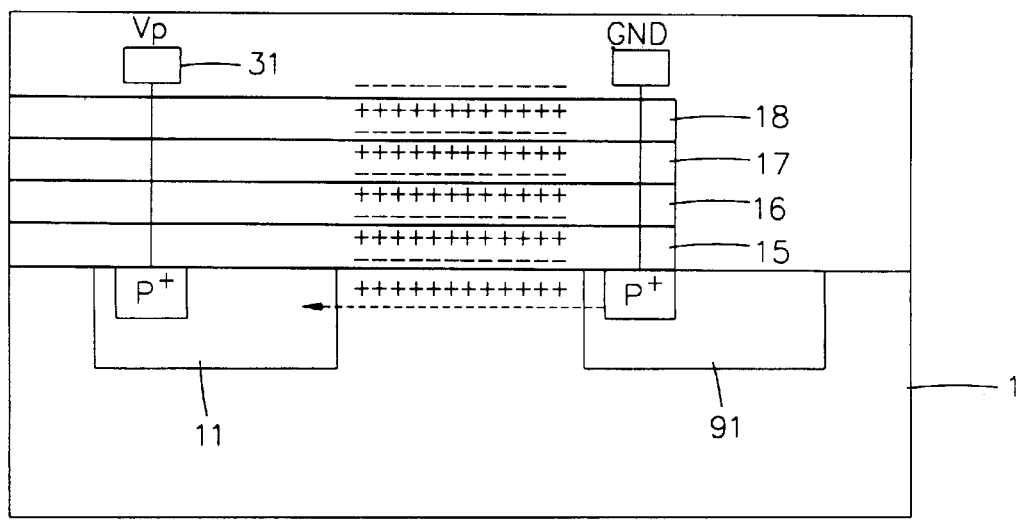
FIG. 3 is a schematic view illustrating a charge-up phenomenon by a plasma.
Figure 4:
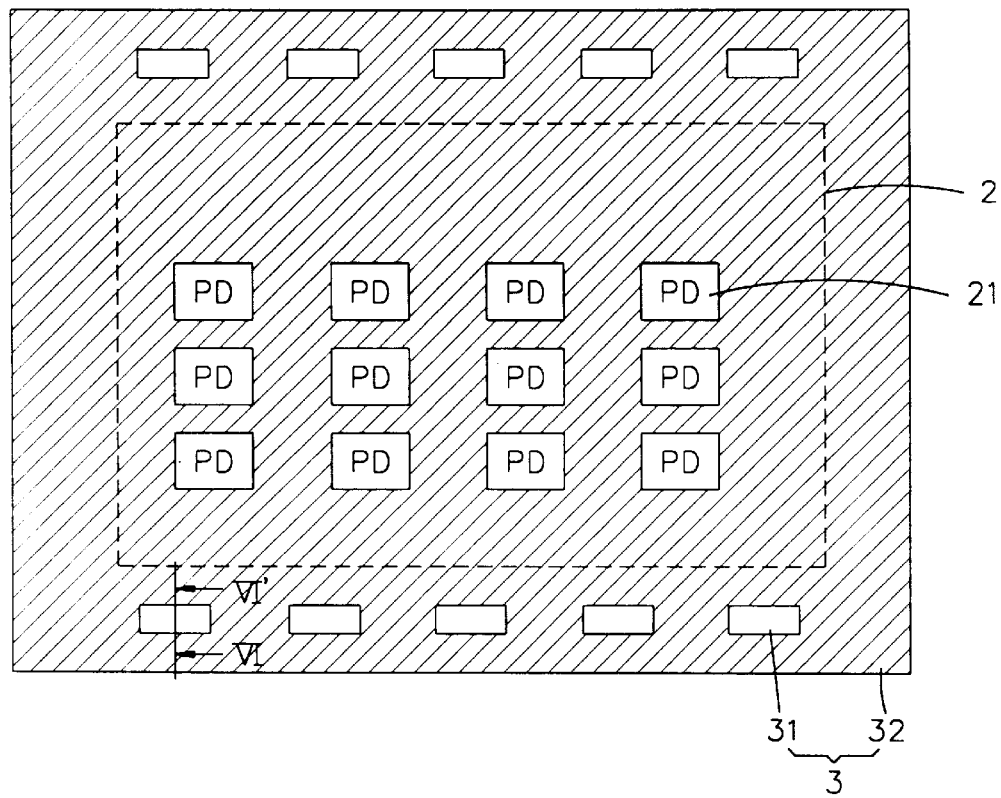
FIG. 4 is a plan view illustrating a semiconductor device according a first embodiment of the present invention.

FIG. 4 illustrates a plan view of a semiconductor device according to the present invention.

A semiconductor device center portion 2 including a passing through portion 21 and a blocking portion 22 is formed in the center portion of a semiconductor substrate, and a semiconductor device peripheral portion 3 including a pad 31 and a discharging portion 32 is formed in an edge portion of the semiconductor substrate.

Figure 5:
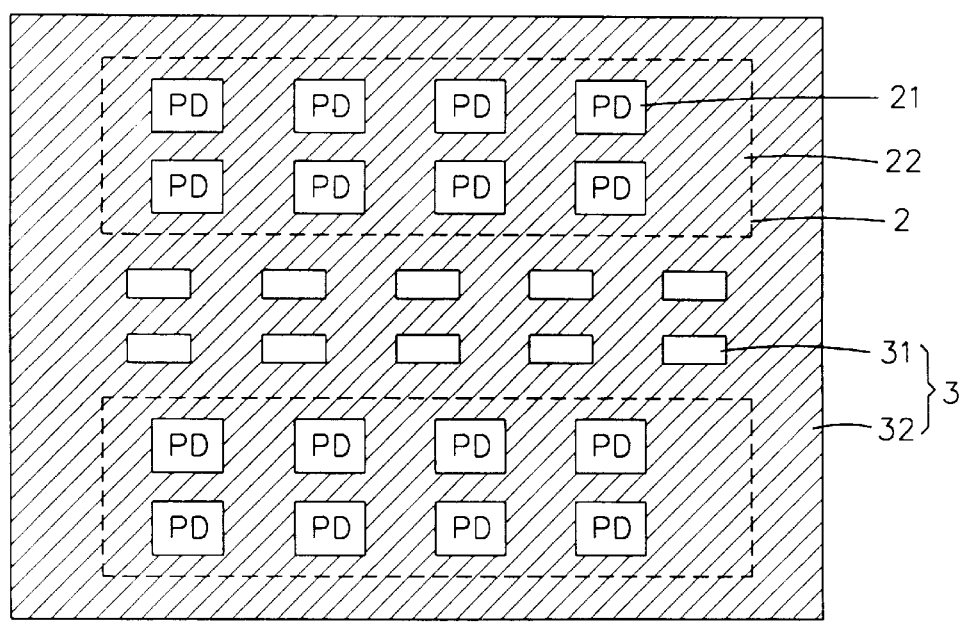
FIG. 5 is a plan view illustrating a semiconductor device according to a second embodiment of the present invention.

In the embodiment of the present invention as shown in FIG. 4, the peripheral portion 3 is formed in the edge portion of the semiconductor substrate. More preferably, the semiconductor device peripheral portion 3 including the pad and the discharging portion may be formed in the center portion of the semiconductor substrate. At this time, the center portion 2 is divided into two or more than four blocks. FIG. 5 illustrates an embodiment of the semiconductor device formed in the center portion of the semiconductor substrate.

Figure 6:
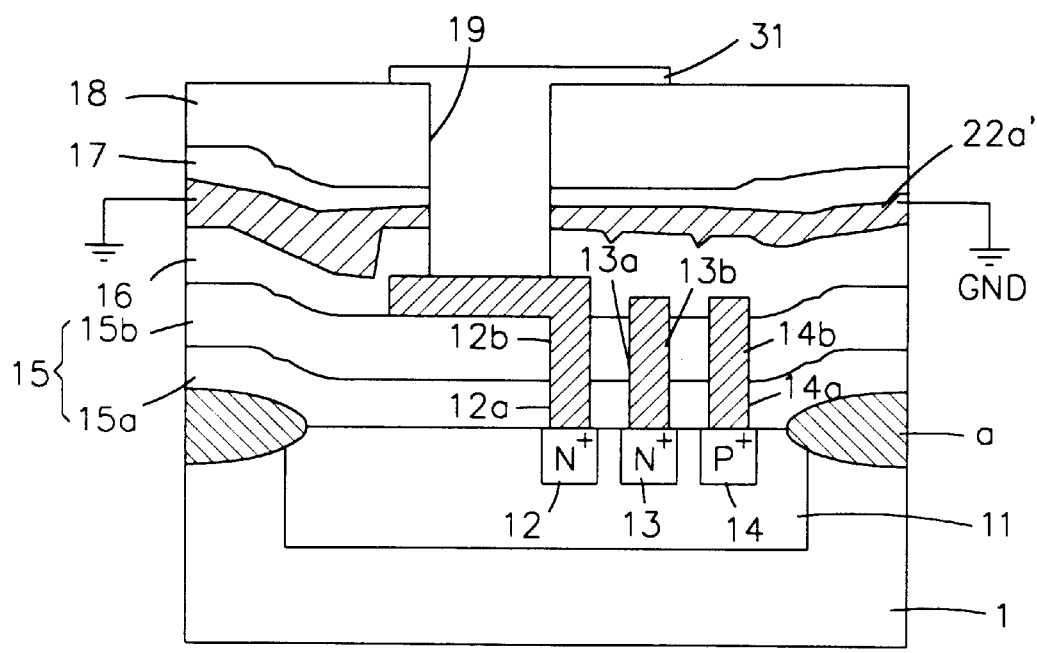
FIG. 6 is a cross-sectional view taken along the line II—II' of FIG. 2.

FIG. 6 is a vertical cross-sectional view taken along the line VI—VI' of the semiconductor device according to the present invention. Namely, an ESD p-well 11 is formed in the n-type semiconductor substrate 1, and an n+ type or p+ type diffusion layers 12 and 13 are formed in the ESD p-well 11 for connecting an input/output pad 31, and a device isolation region "a" is formed on the upper surface of the peripheral portion of the p-well 11. A first insulation layer 15 is formed on the upper surface of the semiconductor substrate 1. At this time, the first insulation layer is formed in a double structure of an HLD layer 15a and a BPSG layer 15b. Contact holes 12a, 13a and 14a are formed on the diffusion layers 12, 13 and 14. Metallic wiring portions 12b, 13b and 14b are formed in the contact holes 12a, 13a and 14a and on the upper surface of the first insulation layer 15, respectively, and a second insulation layer 16 is formed on the upper surfaces of the metallic wiring portions 12b, 13b and 14b and the first insulation layer 15. A photo metallic layer 22a is formed on the upper surface of the second insulation layer 16, and a protection layer 17 and a planerizing layer 18 are formed on the upper surface of the photo metallic layer 22a. The photo metallic layer 22a is connected with a ground. A pad hole 19 is formed on the upper surface of the metallic wiring portion. A pad 31 is formed in the pad hole 19.

The fabrication method for a semiconductor device according to the present invention will now be explained with reference to the accompanying drawings.

First, a p-type dopant ion is implanted into a predetermine portion of the semiconductor substrate 1 for forming an ESD p-well 11 and a main p-well (not shown). Thereafter, a device isolation region "a" is formed on the upper surface of the semiconductor substrate and at both sides of the p-well 11 using a LOCOS process. Next, the n-type diffusion layers 12 and 13 are formed in the p-well 11, and then a p-well diffusion layer 14 is formed. Thereafter, the first insulation film 15 is formed thereon. The first insulation film 15 is formed by sequentially depositing the HLD layer 15a and the BPSG layer 15b. Thereafter, the contact holes 12a, 13a and 14a are formed by etching the first insulation film 15 formed on the n-type and p-type diffusion layers 12, 13 and 14. A metallic film is coated on the inner surfaces of the contact holes 12a, 13a and 14a and on the upper surface of the first insulation film and then are patterned for thereby forming the metallic wiring portions 12b, 13b and 14b. Thereafter, the second insulation film 16 is formed on the upper surfaces of the metallic wiring portion and the first insulation film 15, and the photo metallic layer 22a, namely, the metallic layer, is formed on the upper surface of the second insulation film 16 for blocking light, and the photo metallic layer 22a of the photo diode portion 21 formed in the semiconductor device center portion 2 is etched. At this time, in the present invention, the photo metallic layer 22a formed on the peripheral portion 3 is left without etching and removing the same differently from the known fabrication method for the semiconductor device in which the photo metallic layer 22a formed in the peripheral portion 3 is etched. Thereafter, a P-SiN film 17 is formed as a protection film for protecting the semiconductor device, and the protection film 17 is etched for forming the pad hole 19 by exposing the upper surface of the metallic wiring portion 12b. The planarizing layer 18 is formed on the upper surface of the protection film 17 for planarizing the upper surface of the semiconductor device for performing a u-lens process. The planarizing layer 18 is etched for exposing the metallic wiring portion 12b, and a metallic member is deposited in the internal of the pad hole 19 for thereby forming the pad 31.

In the present invention, since the photo metallic layer 22a of the semiconductor device peripheral portion 3 is not removed but left, the negative electric charges induced by plasma during the semiconductor device fabrication process are discharged along the photo metallic layer 22a of the device peripheral portion 3 as a ground voltage.

As described above, in the semiconductor device and the fabrication method thereof according to the present invention, since the electric charges generated during the fabrication process which uses a plasma are continuously discharged, it is possible to prevent the charge-up phenomenon. Therefore, the reliability of the product is enhanced by preventing a malfunction of the semiconductor device. In addition, since it is possible to prevent any damages to the semiconductor device, for example, to the gate oxide film, the yield of the semiconductor device may be increased. Furthermore, it is possible to obtain a predetermined uniformity in the device characteristics of the semiconductor chips disposed on the edge portions of the wafer as well as the semiconductor chips disposed on the center portion of the wafer in the known art.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device, comprising:
   a first portion having at least one photodiode portion that passes light therethrough and a blocking portion that blocks light; and
   a second portion adjacent to the first portion having a discharging layer that is formed continuous with the blocking portion and a pad that passes through the discharging layer to provide electrical interconnection of the semiconductor device.

2. The semiconductor device of claim 1, wherein the discharging layer is formed in an edge portion of the semiconductor device.

3. The semiconductor device of claim 1, wherein the discharging layer is formed around a periphery of the pad.

4. The semiconductor device of claim 1, wherein the pad and the discharging portion are formed in a center portion of the semiconductor device.

5. The semiconductor device of claim 1, wherein the discharging layer is formed of a metallic layer connected with a ground.

6. The semiconductor device of claim 1, wherein the discharging layer and the blocking portion are formed of a photo metallic layer.

7. The semiconductor device of claim 1, further comprising:
   a semiconductor substrate;
   a diffusion layer formed in the semiconductor substrate;
   a metallic wiring portion formed on an upper surface of the semiconductor substrate in contact with the diffusion layer; and
   at least one insulation layer formed on upper surfaces of the metallic wiring portion and the semiconductor substrate such that the discharging layer is formed on an upper surface of the at least one insulation layer.

8. The semiconductor device of claim 7, wherein a protection layer and a planarizing layer are formed on an upper surface of the photo metallic layer.

9. The semiconductor device of claim 7, wherein the diffusion layer is formed in an electrostatic discharge well of the semiconductor substrate.

10. The semiconductor device of claim 7, wherein the pad is in contact with the discharging layer.

11. A semiconductor device, comprising:

a semiconductor substrate;

a diffusion layer formed in a first portion of the semiconductor substrate;

a photodiode formed in a second portion of the semiconductor substrate;

a first insulation layer disposed on an upper surface of the semiconductor substrate;

a conductive wiring portion disposed through the first insulation layer to contact the diffusion layer;

a second insulation layer disposed on upper surfaces of the first insulation layer and the conductive wiring portion;

a discharging layer formed of a photo metallic material disposed on an upper surface of the second insulation layer to block light, the discharging layer exposing the photodiode; and a pad disposed through the discharging layer to provide electrical interconnection with the conductive wiring portion.

12. The semiconductor device of claim 11, wherein the discharging layer is grounded.

* * * * *